US010364486B2

(12) United States Patent
Adu

(10) Patent No.: US 10,364,486 B2
(45) Date of Patent: Jul. 30, 2019

(54) CARBON-BASED NANOTUBE/METAL COMPOSITE AND METHODS OF MAKING THE SAME

(71) Applicant: The Penn State Research Foundation, University Park, PA (US)

(72) Inventor: Kofi W. Adu, State College, PA (US)

(73) Assignee: The Penn State Research Foundation, University Park, PA (US)

(*) Notice: Subject to any disclaimer, the term of this patent is extended or adjusted under 35 U.S.C. 154(b) by 324 days.

(21) Appl. No.: 15/302,370

(22) PCT Filed: Apr. 9, 2015

(86) PCT No.: PCT/US2015/025158
§ 371 (c)(1),
(2) Date: Oct. 6, 2016

(87) PCT Pub. No.: WO2015/157542
PCT Pub. Date: Oct. 15, 2015

(65) Prior Publication Data
US 2017/0022587 A1    Jan. 26, 2017

Related U.S. Application Data

(60) Provisional application No. 61/977,210, filed on Apr. 9, 2014.

(51) Int. Cl.
C22C 32/00       (2006.01)
C22C 1/02        (2006.01)
(Continued)

(52) U.S. Cl.
CPC ........ *C22C 32/0084* (2013.01); *C01B 32/168* (2017.08); *C01B 32/17* (2017.08);
(Continued)

(58) Field of Classification Search
None
See application file for complete search history.

(56) References Cited

U.S. PATENT DOCUMENTS 6,860,314 B1 * 3/2005 Koide ............... B22D 17/007
164/113
8,261,961 B2    9/2012 Brice
(Continued)

FOREIGN PATENT DOCUMENTS

WO    2007073494    6/2007
WO    2008140649    11/2008

OTHER PUBLICATIONS

Chen et al., "Tribological application of carbon nanotubes in a metal-based composite coating and composites"; Carbon, 2003, 41, 215-222, no month available; 8 pages.*
(Continued)

*Primary Examiner* — Helene Klemanski
(74) *Attorney, Agent, or Firm* — Michael Best & Friedrich LLP

(57) ABSTRACT

A nanocomposite comprising metal and carbon-based nanotube (CNT), wherein the carbon-based nanotube comprises a doping element selected from the group consisting of boron (B), iron (Fe), zinc (Zn), nickel (Ni), cadmium (Cd), tin (Sn), antimony (Sb), Nitrogen (N) and the combination thereof, and methods of making the nanocomposite.

31 Claims, 7 Drawing Sheets

(51) Int. Cl.
    *C22C 1/04*     (2006.01)
    *C22C 1/05*     (2006.01)
    *C22C 9/00*     (2006.01)
    *C22C 21/00*     (2006.01)
    *C22C 26/00*     (2006.01)
    *C01B 32/17*     (2017.01)
    *C01B 32/168*     (2017.01)
    *C30B 1/00*     (2006.01)

(52) U.S. Cl.
    CPC .............. *C22C 1/02* (2013.01); *C22C 1/0416* (2013.01); *C22C 1/0425* (2013.01); *C22C 1/05* (2013.01); *C22C 9/00* (2013.01); *C22C 21/00* (2013.01); *C22C 26/00* (2013.01); *C30B 1/00* (2013.01); *C01B 2202/30* (2013.01); *C01B 2202/34* (2013.01); *C01B 2202/36* (2013.01); *C22C 2026/002* (2013.01)

(56) References Cited

U.S. PATENT DOCUMENTS

| | | | |
|---|---|---|---|
| 8,287,622 B2 | 10/2012 | Li et al. | |
| 8,333,947 B2 | 12/2012 | Ohta et al. | |
| 8,459,983 B2* | 6/2013 | Belzile | B29C 45/27 264/328.15 |
| 8,499,817 B2* | 8/2013 | Hu | C22C 26/00 164/97 |
| 2003/0158323 A1 | 8/2003 | Connell et al. | |
| 2007/0036978 A1* | 2/2007 | Chen | C22C 26/00 428/408 |
| 2008/0093577 A1* | 4/2008 | Khraishi | C22C 26/00 252/67 |
| 2008/0191606 A1* | 8/2008 | Geohegan | B82Y 30/00 313/501 |
| 2009/0162654 A1 | 6/2009 | So et al. | |
| 2010/0203351 A1* | 8/2010 | Nayfeh | C03C 4/12 428/622 |
| 2010/0219383 A1 | 9/2010 | Eklund | |
| 2011/0180968 A1 | 7/2011 | Hu et al. | |
| 2012/0031644 A1 | 2/2012 | Maxwell et al. | |
| 2012/0152480 A1 | 6/2012 | Nayfeh et al. | |
| 2012/0164429 A1 | 6/2012 | Shah et al. | |
| 2012/0267141 A1 | 10/2012 | Kamiyama et al. | |
| 2013/0098208 A1* | 4/2013 | Li | C22C 47/08 75/708 |
| 2014/0286852 A1* | 9/2014 | Nicholas | B82Y 40/00 423/447.3 |
| 2018/0002179 A1* | 1/2018 | Okamoto | B82Y 30/00 |
| 2018/0126456 A1* | 5/2018 | So | C22C 26/00 |

OTHER PUBLICATIONS

Tu et al., "Tribological properties of carbon-nanotube-reinforced copper composites", Tribology Letters vol. 10, No. 4, 2001, 225-228, no month available; 4 pages.*

Bakshi et al., "Carbon nanotube reinforced metal matrix composites—a review," International Materials, 55 (1), 41-64 (2010).

Kwon and Leparoux, "Dual-nanoparticulate-reinforced aluminum matrix composite materials," Nanotechnology, 23 (22), 1-9, May 2012.

McGuire et al., "Synthesis and Raman characterization of boron-doped single-walled carbon nanotubes," Carbon, 43 (2), 219-227 (2005).

Monteiro et al., "Production and characterization of boron-doped single wall carbon nanotubes," J. Phys. Chem. C, 116 (5), 3281-3285, Jan. 2012.

"Shin et al., ""Electrical and thermal conductivities ofaluminum-based composites containing multi-walled carbon nanotubes,"" Journal of Composite Materials, 47 (18), 2249-2256 (2012)".

International Search Report and Written Opinion for Application No. PCT/US2015/025158 dated Jul. 14, 2015 (8 pages).

International Preliminary Report on Patentability for Application No. PCT/US2015/025158 dated Oct. 20, 2016 (6 pages).

* cited by examiner

CARBON-BASED NANOTUBE/METAL COMPOSITE AND METHODS OF MAKING THE SAME

CROSS-REFERENCE TO RELATED APPLICATIONS

This application is a U.S. national stage filing under 35 U.S.C. 371 of International Application No. PCT/US2015/025158, filed Apr. 9, 2015, which application claims priority to U.S. Provisional Patent Application No. 61/977,210, filed Apr. 9, 2014, each of which are incorporated herein by reference in their entireties.

INTRODUCTION

Metal-based materials with enhanced properties are sought for a variety of applications.

SUMMARY

In one aspect, disclosed are nanocomposites. The nanocomposites may comprise metal and carbon-based nanotube (CNT), wherein the carbon-based nanotube comprises a doping element selected from the group consisting of boron (B), iron (Fe), zinc (Zn), nickel (Ni), cadmium (Cd), tin (Sn), antimony (Sb), Nitrogen (N) and the combination thereof. Additionally, disclosed are composite materials comprising aluminum and boron doped-CNT. The metal may be either aluminum or copper. The composites and/or the nanocomposites may comprise a carbon-based nanotube that is a SWCNT, DWCNT and/or MWCNT.

In another aspect, disclosed are methods of synthesizing a nanocomposite. The method may comprise suspending a doped carbon-based nanotube and metal in a suspension, wherein the carbon-based nanotube comprises a doping element selected from the group consisting of boron (B), iron (Fe), zinc (Zn), nickel (Ni), cadmium (Cd), tin (Sn), antimony (Sb), Nitrogen (N) and the combination thereof; and inductively melting the suspension comprising the carbon-based nanotube and metal to provide metal, doped CNT nanocomposites. The method may comprise a carbon-based nanotube that is a SWCNT, DWCNT and/or MWCNT. The method may comprise a dispersant. The method may further comprise doping the carbon-based nanotube with a boron precursor to form a boron-doped carbon-based nanotube; and further coating the surface of the carbon-based nanotube with Fe, Ni, Cd, Sb, Zn, Sn or a combination thereof. The boron precursor may be in a solution; this solution may further include a halogen; and the boron precursor may comprise $BBr_3$ or $BI_3$. The method may comprise purifying the B-carbon-based nanotube. The method may further comprise suspending the B-carbon-based nanotube in a dispersant. The method may comprise aluminum granules. The method may comprise the carbon-based nanotubes being evenly dispersed within the nanocomposite.

The method may comprise a nanocomposite wherein the diameter of the carbon-based nanotube is from about 0.5 nm to about 10 nm, wherein the length of the carbon-based nanotube is from about 0.5 μm to about 100 μm, or a combination thereof. The method may comprise a nanocomposite comprising about 0.00001 wt. % to about 40 wt. % carbon-based nanotubes. The method may comprise a nanocomposite having a bulk resistivity of about 0.5 μΩcm to about 3 μΩcm at room temperature; a thermal conductivity of 200 W/m K to about 650 W/m K at room temperature; a coefficient of thermal expansion of about 5 μm/m K to about 30 μm/m K at room temperature; a specific heat of about 0.1 J/g °C. to about 0.9 J/g °C.; a tensile strength of about 40 MPa to about 600 MPa; a bulk modulus of elasticity of about 60 GPa to about 300 GPa; or a combination thereof.

In another aspect, disclosed are automobiles, aircrafts, aerospace and space, electronic components or sporting devices comprising the nanocomposite. Additionally, disclosed are electrical wires comprising the nanocomposite.

Other aspects of the invention will become apparent by consideration of the detailed description and accompanying drawings.

DETAILED DESCRIPTION

Figure 1:
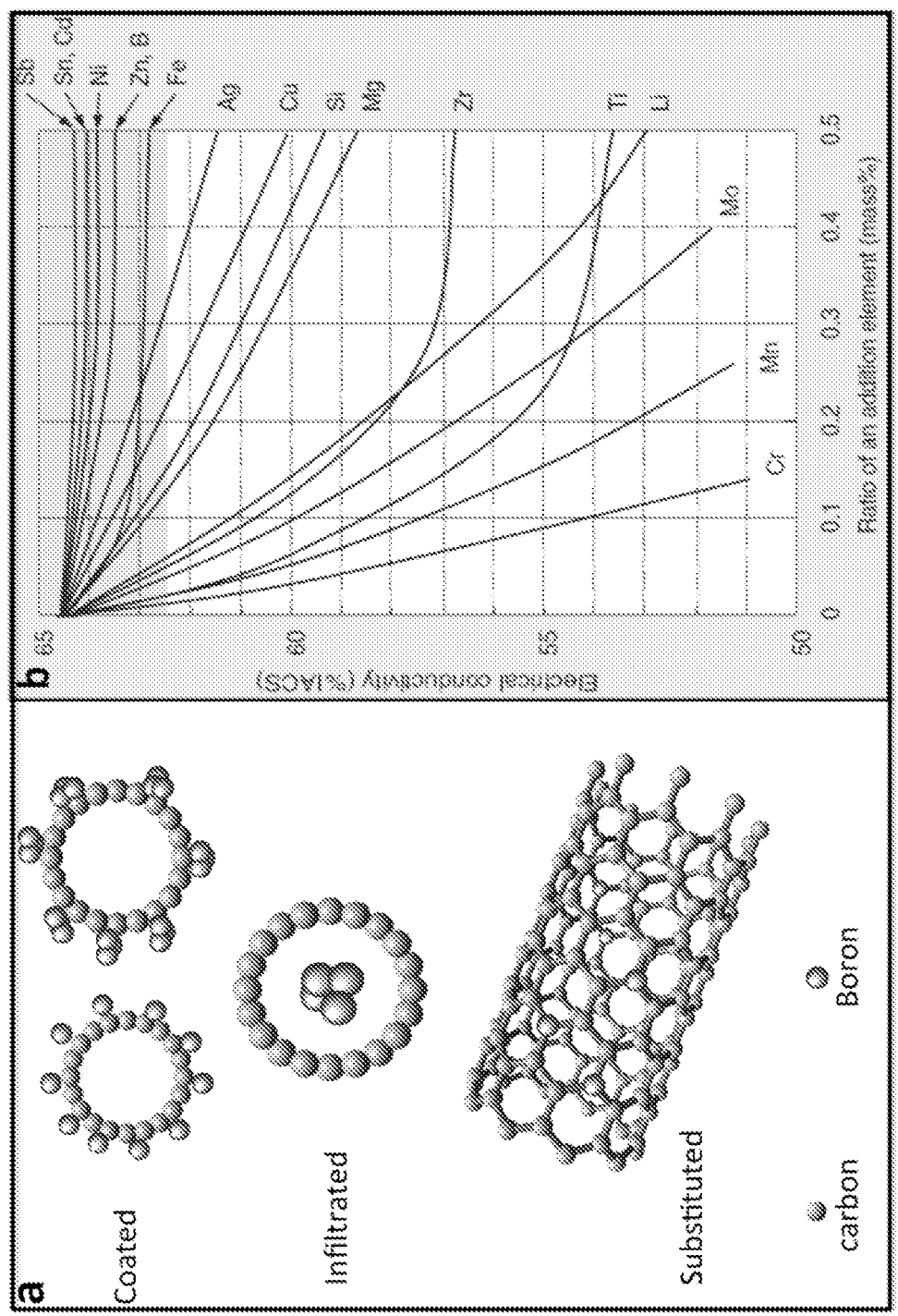
FIG. 1 shows (a) schematics of modification of the carbon-based nanotubes (CNTs) structures by coating the surface with boron (top image), infiltrating with B (middle image) and chemical substituting B into the CNT structure (bottom image); (b) effect of elemental additive on the electrical conductivity of pure Al.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are incorporated by reference in their entirety. The materials, methods, and examples disclosed herein are illustrative only and not intended to be limiting.

The terms "comprise(s)," "include(s)," "having," "has," "can," "contain(s)," and variants thereof, as used herein, are intended to be open-ended transitional phrases, terms, or words that do not preclude the possibility of additional acts or structures. The singular forms "a," "an" and "the" include plural references unless the context clearly dictates otherwise. The present disclosure also contemplates other embodiments "comprising," "consisting of" and "consisting essentially of," the embodiments or elements presented herein, whether explicitly set forth or not.

Several techniques have been employed in fabricating aluminum/carbon-based nanotube (Al-CNT) nanocomposites. Most notable of these techniques are powder metallurgy, melting and solidification, electrochemical deposition, thermal spray and others (molecular level mixing, spattering techniques, sandwich processing, etc.). However, many major challenges still hinder the progress in developing Al-CNT nanocomposites, especially nanocomposites with increased electrical conductivity. From a fabrication standpoint, several challenges may hinder progress in developing enhanced Al-CNT nanocomposites, including, but not limited to, the nonwettability of the CNTs by Al liquid; the interfacial bond strength between the CNTs and the Al matrix; chemical and structural stability of the CNTs in the Al matrix; the poor dispersion of the CNTs in the Al matrix, and the poor ductility of the end product. For example, the poor adhesion of the CNTs to Al may result in fractures in the nanocomposites during the wire fabrication process. Thus, there is a need for enhanced metal-CNT composite materials.

1. Nanocomposites

Disclosed herein are nanocomposites that may be used in numerous applications. The nanocomposite may comprise carbon-based nanotube, metal and a doping element. The metal may comprise aluminum or copper. The doping element may comprise boron, nitrogen, iron, zinc, nickel, cadmium, tin, antimony or combinations thereof.

A. Metal

The nanocomposite may comprise a metal. The metal may comprise aluminum or copper. The metal may comprise powder, granules, large aggregates or combinations thereof. The nanocomposite may comprise the metal at about 60 wt. % to about 99.999 wt. %. For example, the nanocomposite may comprise the metal at less than 99.999 wt. %, less than 95 wt. %, less than 90 wt. %, less than 85 wt. %, less than 80 wt. %, less than 75 wt. %, less than 70 wt. %, less than 65 wt. %, or less than 60 wt. %. Additionally, the nanocomposite may comprise the metal at greater than 60 wt. %, greater than 65 wt. %, greater than 70 wt. %, greater than 75 wt. %, greater than 80 wt. %, greater than 85 wt. %, greater than 90 wt. %, greater than 95 wt. %, or greater than 99.999 wt. %.

B. Carbon-Based Nanotubes

The nanocomposite may comprise a carbon-based nanotube (CNT). The CNT may comprise at least one of a single-walled CNT (SWCNT), double-walled CNT (DW-CNT), multi-walled CNT (MWCNT), or combinations thereof. CNTs possess high surface area and high aspect ratio, and these properties can be advantageous when introducing CNTs within the nanocomposite. For example, CNTs may provide enhanced tensile strength, enhanced thermal conductivity, enhanced electrical conductivity, reduced specific heat capacity, reduced coefficient of thermal expansion, and combinations thereof. However, it should be noted that CNTs also can be detrimental to overall properties of the nanocomposite, especially if introduced within the nanocomposite in a non-homogenous morphology. Therefore it is critical for the CNTs to be homogenously dispersed within the nanocomposite.

The present disclosure provides nanocomposites that may be homogenously dispersed within the nanocomposite. The CNTs may have enhanced interfacial bond strength with the metal of the nanocomposite. The CNTs may be completely wettable with the metal of the nanocomposite. The interfacial bond strength may be estimated using theoretical calculations. Specifically, based on density functional theory calculations, there may be an approximately 5% decrease in bond length, and an approximately 150% increase in adsorption energy of Al at sites with additives such as B compared to that of carbon sites. Transmission electron microscopy may be used to investigate the interfacial components of the nanocomposite.

The CNTs may comprise additional elements (e.g., doped CNTs). The additional element may be boron, nitrogen, iron, zinc, nickel, cadmium, tin, antimony or combinations thereof. These elements may be introduced into or onto CNTs to form a CNT hybrid material, by either coating the surface with nanoparticles or clusters of the element via chemisorption or physisorption, or incorporating the element (e.g., adatom) into the CNT structure by elemental (chemical) substitution or by infiltration into the pores of the CNT. The element may be introduced into CNTs during synthesis of the CNTs, or after synthesizing the CNTs. The element may be added as a single adatom, cluster or nanoparticle as shown schematically in FIG. 1a. The element may be soluble in the metal matrix, may bind to the CNT structure, and may have a limited degrading effect on the intrinsic properties of the metal (see FIG. 1b). The CNT may comprise a single tube, bundle of tubes or combinations thereof. The CNT may have a diameter from about 0.5 nm to about 50 nm, wherein the length of the CNT may be from about 0.5 µm to about 1000 µm, or a combination thereof. For example, the CNT may comprise a diameter of less than 10 nm, less than 9 nm, less than 8 nm, less than 7 nm, less than 6 nm, less than 5 nm, less than 4 nm, less than 3 nm, less than 2 nm, less than 1 nm, or less than 0.5 nm. Additionally, the CNT may comprise a diameter of greater than 0.5 nm, greater than 1 nm, greater than 2 nm, greater than 3 nm, greater than 4 nm, greater than 5 nm, greater than 6 nm, greater than 7 nm, greater than 8 nm, greater than 9 nm, or greater than 10 nm.

The CNT may comprise a length of less than 1000 µm, less than 900 µm, less than 800 µm, less than 700 µm, less than 600 µm, less than 500 µm, less than 400 µm, less than 300 µm, less than 200 µm, less than 100 µm, less than 90 µm, less than 80 µm, less than 70 µm, less than 60 µm, less than 50 µm, less than 40 µm, less than 30 µm, less than 20 µm, less than 10 µm, less than 9 µm, less than 8 µm, less than 7 µm, less than 6 µm, less than 5 µm, less than 4 µm, less than 3 µm, less than 2 µm, less than 1 µm, or less than 0.5 µm. Additionally, the CNT may comprise a length of greater than 0.5 µm, greater than 1 µm, greater than 2 µm, greater than 3 µm, greater than 4 µm, greater than 5 µm, greater than 6 µm, greater than 7 µm, greater than 8 µm, greater than 9 µm, greater than 10 µm, greater than 20 µm, greater than 30 µm, greater than 40 µm, greater than 50 µm, greater than 60 µm, greater than 70 µm, greater than 80 µm, greater than 90 µm, greater than 100 µm, greater than 200 µm, greater than 300 µm, greater than 400 µm, greater than 500 µm, greater than 600 µm, greater than 700 µm, greater than 800 µm, greater than 900 µm, or greater than 1000 µm.

Carbon-based nanotubes provide unique advantages to the nanocomposite. CNTs may provide increased tensile strength and other enhanced physical properties (e.g., thermal conductivity, coefficient of thermal expansion, specific heat capacity, etc.), but when used above a certain wt %, may lead to a decrease in conductivity of the nanocomposite. Thus, a critical range of CNTs within the nanocomposite is needed to take advantage of the increased physical properties, while not compromising the electrical properties of the nanocomposite. The nanocomposite may comprise the CNT at from about 0.00001 wt. % to about 40 wt. %. The nanocomposite may comprise the CNT at from about 0.001 wt. % to about 5 wt. %. For example, the nanocomposite may comprise the CNT at less than 40 wt. %, less than 35 wt. %, less than 30 wt. %, less than 25 wt. %, less than 20 wt. %, less than 15 wt. %, less than 10 wt. %, less than 5 wt. %, less than 4 wt. %, less than 3 wt. %, less than 2 wt. %, less than 1 wt. %, less than 0.5 wt. %, less than 0.25 wt. %, less than 0.1 wt. %, less than 0.05 wt. %, less than 0.025 wt. %, less than 0.01 wt. %, less than 0.005 wt. %, less than 0.0025 wt. %, less than 0.001 wt. %, less than 0.0005 wt. %, less than 0.00025 wt. %, less than 0.0001 wt. %, less than 0.00005 wt. %, less than 0.000025 wt. %, or less than 0.00001 wt. %.

Additionally, the nanocomposite may comprise the CNT at greater than 0.00001 wt. %, greater than 0.000025 wt. %, greater than 0.00005 wt. %, greater than 0.0001 wt. %, greater than 0.00025 wt. %, greater than 0.0005 wt. %, greater than 0.001 wt. %, greater than 0.0025 wt. %, greater than 0.005 wt. %, greater than 0.01 wt. %, greater than 0.025 wt. %, greater than 0.05 wt. %, greater than 0.1 wt. %, greater than 0.25 wt. %, greater than 0.5 wt. %, greater than 1 wt. %, greater than 5 wt. %, greater than 10 wt. %, greater than 15 wt. %, greater than 20 wt. %, greater than 25 wt. %, greater than 30 wt. %, greater than 35 wt. %, or greater than 40 wt. %.

i. Doping Element

Figure 2:
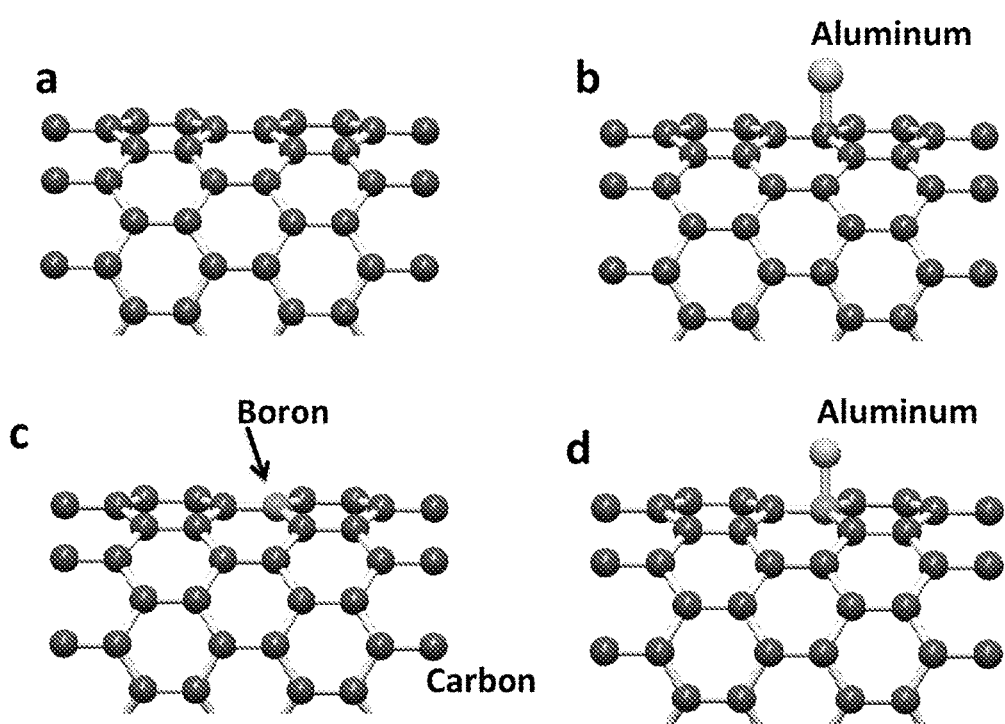
FIG. 2 Shows (a) CNT structure (b) Interaction of Al with C in CNT structure (c) boron substituted CNT structure and (d) interaction of Al with the CNT structure at the boron site. Density functional theory calculations predict enhanced adsorption energy of Al at the B site.

The element used to dope the CNT may be boron, nitrogen, iron, zinc, nickel, cadmium, tin, antimony or combinations thereof. The doping elements may enhance thermophysical and mechanical properties of the nanocomposite. Ranges and presentation of the elements within in the nanocomposite are critical, wherein if elements are presented in an improper range or presentation, nanocomposites may have decreased electrical conductivity. For example, even minute dilutions of an element in Al may decrease the electrical conductivity of Al as shown in FIG. 1b. However, a few elements have a limited effect on the electrical conductivity of Al upon minute dilution. Such elements include Sb<Sn, Cd<Ni<B, Zn<Fe, in increasing order of effect. Boron's low molecular weight and solubility in Al may be advantageous for nanocomposite properties (FIG. 2). Additionally, boron may have a limited impact on the electrical conductivity of the nanocomposite.

The doping element is not present within the nanocomposite, unless it is physically associated with the CNT. For example, the doping element may be incorporated onto the surface of the CNT, within the skeletal structure of the CNT, or infiltrated into the pores of the CNT. Coating the surface of CNTs via physisorption and/or chemisorption with the doping element may provide a higher doping capacity due to the formation of nanoparticles/clusters, compared to incorporating the element (adatom) within the skeletal structure. Doping the CNT by chemical (adatom) substitution is preferred since it allows optimal loading of the element within the CNT. Regardless of the method to introduce the doping element, each element instills unique characteristics when used within the CNT (see FIG. 1b).

The CNT may comprise the doping element at from about 0.1 wt % to about 30 wt %. The CNT may comprise the doping element at from about 0.1 wt % to about 5 wt %. The CNT may comprise the doping element from about 1 wt % to about 5 wt %. For example, the CNT may comprise the doping element at less than 30 wt. %, less than 25 wt. %, 20 wt. %, less than 15 wt. %, less than 10 wt. %, less than 5 wt. %, less than 4.9 wt. %, less than 4.8 wt. %, less than 4.7 wt. %, less than 4.6 wt. %, less than 4.5 wt. %, less than 4.4 wt. %, less than 4.3 wt. %, less than 4.2 wt. %, less than 4.1 wt. %, less than 4 wt. %, less than 3.9 wt. %, less than 3.8 wt. %, less than 3.7 wt. %, less than 3.6 wt. %, less than 3.5 wt. %, less than 3.4 wt. %, less than 3.3 wt. %, less than 3.2 wt. %, less than 3.1 wt. %, less than 3 wt. %, less than 2.9 wt. %, less than 2.8 wt. %, less than 2.7 wt. %, less than 2.6 wt. %, less than 2.5 wt. %, less than 2.4 wt. %, less than 2.3 wt. %, less than 2.2 wt. %, less than 2.1 wt. %, less than 2 wt. %, less than 1.9 wt. %, less than 1.8 wt. %, less than 1.7 wt. %, less than 1.6 wt. %, less than 1.5 wt. %, less than 1.4 wt. %, less than 1.3 wt. %, less than 1.2 wt. %, less than 1.1 wt. %, less than 1 wt. %, less than 0.9 wt. %, less than 0.8 wt. %, less than 0.7 wt. %, less than 0.6 wt. %, less than 0.5 wt. %, less than 0.4 wt. %, less than 0.3 wt. %, less than 0.2 wt. %, or less than 0.1 wt %.

Additionally, the CNT may comprise the doping element at greater than 0.1 wt. %, greater than 0.2 wt. %, greater than 0.3 wt. %, greater than 0.4 wt. %, greater than 0.5 wt. %, greater than 0.6 wt. %, greater than 0.7 wt. %, greater than 0.8 wt. %, greater than 0.9 wt. %, greater than 1 wt. %, greater than 1.1 wt. %, greater than 1.2 wt. %, greater than 1.3 wt. %, greater than 1.4 wt. %, greater than 1.5 wt. %, greater than 1.6 wt. %, greater than 1.7 wt. %, greater than 1.8 wt. %, greater than 1.9 wt. %, greater than 2 wt. %, greater than 2.1 wt. %, greater than 2.2 wt. %, greater than 2.3 wt. %, greater than 2.4 wt. %, greater than 2.5 wt. %, greater than 2.6 wt. %, greater than 2.7 wt. %, greater than 2.8 wt. %, greater than 2.9 wt. %, greater than 3 wt. %, greater than 3.1 wt. %, greater than 3.2 wt. %, greater than 3.3 wt. %, greater than 3.4 wt. %, greater than 3.5 wt. %, greater than 3.6 wt. %, greater than 3.7 wt. %, greater than 3.8 wt. %, greater than 3.9 wt. %, greater than 4 wt. %, greater than 4.1 wt. %, greater than 4.2 wt. %, greater than 4.3 wt. %, greater than 4.4 wt. %, greater than 4.5 wt. %, greater than 4.6 wt. %, greater than 4.7 wt. %, greater than 4.8 wt. %, greater than 4.9 wt. %, greater than 5 wt. %, greater than 10 wt. %, greater than 15 wt. %, greater than 20 wt. %, greater than 25 wt. %, or greater than 30 wt. %.

2. Methods of Making the Nanocomposites

Provided herein are methods of making the nanocomposites. The CNT and metal may be in suspension form prior to forming the nanocomposite. The suspension may or may not comprise a dispersant. The CNT may be purified prior to contacting the suspension. The CNT may be suspended in a dispersant prior to contacting the suspension. The CNT may be suspended without the dispersant. As detailed above, the CNT may be modified (e.g., doped) with an additional element prior to synthesizing the nanocomposite. The additional element may be boron. The additional element may further comprise iron, zinc, nickel, cadmium, tin, antimony, nitrogen or combinations thereof.

The CNTs may be doped via a gas phase, liquid phase or solid phase. CNT doping via liquid phase may comprise a halogen. CNT doping via a gas phase may comprise ammonia or $B_2(CO_3)_3$. CNT doping via a solid phase may comprise nanoclusters of the doping element, wherein the CNT is doped using a mechanochemical ball milling technique. Additionally, the doping element may be presented as a halide precursor prior to doping the CNT.

In one embodiment, the CNT may be modified with boron using wet chemistry. The wet chemistry modification of the CNT may comprise boron being coated on the surface of the CNT, or into the skeletal structure of the CNT. The CNT may be purified prior to boron modification. The CNT may be contacted with an etchant for dispersion, as well as to create reactive sites on the skeletal structure of the CNT. The etchant may be bromine. The source of the bromine may comprise $Br_2/BBr_3$ or $Br_2/BI_3$.

Inductive melting may be used to introduce the CNTs homogenously within the metal. The inductive melting technique takes advantage of the induced current (eddy current) in the melt to provide in-situ stirring (mixing)

during the melting process. Specifically, the induced current may generate shear force in the melt to provide in-situ mixing during the melting process. Such novel and innovative approaches may successfully facilitate the immobilization of the CNTs in the metal matrix during the melting process to prevent any phase separation, and at the same time promote homogeneous dispersion. The melting may be done in an inert environment to prevent any oxidation of the CNTs. Specifically, the system may be purged several times with nitrogen to remove any residual oxygen before melting. The melting may be done at temperatures from about 700° C. to about 1100° C. The preferred temperature is approximately 850° C. The formation of aluminum carbide at high temperature may occur. Whereas certain levels of carbide formation enhance the tensile properties, it is detrimental to the electrical properties. Micro-Raman spectroscopy and SEM, as well as other techniques known within the art, may be used to obtain information on the dispersion morphology of the CNTs within the metal matrix. High resolution TEM may be used to investigate the metal/CNT interface, which may identify the type of bonding that facilitates enhanced properties of the composites.

In one embodiment, the CNT hybrid material may be incorporated into an aluminum melt. The CNTs may be incorporated into an aluminum matrix by inductive melting. The CNTs may be homogeneously dispersed throughout the metal matrix. Homogeneous dispersion of the CNTs in the metal melt may be achieved by a two-step dispersion protocol: a pre-dispersion step and an in situ dispersion step. Two different pre-dispersion approaches may be used, one with the aid of a dispersant and the other without any dispersant. In the pre-dispersion technique using a dispersant, the B-CNT hybrid material may be homogenized in a block copolymer/ethanol suspension to coat the surface of the metal granules.

The CNT-metal interface may be a significant factor in strengthening the composite. The high tensile strength and the elastic modulus of the CNT are potentially ineffective if the applied load cannot be transferred from the metal matrix to the CNTs. A strong interface may be used for load transfer from the metal matrix to the CNTs. The use of doped-CNTs may provide the needed interfacial strength for the load transfer, while not compromising the electrical properties of the nanocomposites.

The nanocomposite may have a bulk resistivity of from about 0.5 μΩ cm to about 3 μΩ cm at room temperature. The nanocomposite may have a bulk resistivity less than 3 μΩ cm at room temperature, less than 2.9 μΩ cm at room temperature, less than 2.8 μΩ cm at room temperature, less than 2.7 μΩ cm at room temperature, less than 2.6 μΩ cm at room temperature, less than 2.5 μΩ cm at room temperature, less than 2.4 μΩ cm at room temperature, less than 2.3 μΩ cm at room temperature, less than 2.2 μΩ cm at room temperature, less than 2.1 μΩ cm at room temperature, less than 2 μΩ cm at room temperature, less than 1.9 μΩ cm at room temperature, less than 1.8 μΩ cm at room temperature, less than 1.7 μΩ cm at room temperature, less than 1.6 μΩ cm at room temperature, less than 1.5 μΩ cm at room temperature, less than 1.4 μΩ cm at room temperature, less than 1.3 μΩ cm at room temperature, less than 1.2 μΩ cm at room temperature, less than 1.1 μΩ cm at room temperature, less than 1 μΩ cm at room temperature, less than 0.9 μΩ cm at room temperature, less than 0.8 μΩ cm at room temperature, less than 0.7 μΩ cm at room temperature, less than 0.6 μΩ cm at room temperature, or less than 0.5 μΩ cm at room temperature. Additionally, the nanocomposite may have a bulk resistivity greater than 0.5 μΩ cm at room temperature, greater than 0.6 μΩ cm at room temperature, greater than 0.7 μΩ cm at room temperature, greater than 0.8 μΩ cm at room temperature, greater than 0.9 μΩ cm at room temperature, greater than 1 μΩ cm at room temperature, greater than 1.1 μΩ cm at room temperature, greater than 1.2 μΩ cm at room temperature, greater than 1.3 μΩ cm at room temperature, greater than 1.4 μΩ cm at room temperature, greater than 1.5 μΩ cm at room temperature, greater than 1.6 μΩ cm at room temperature, greater than 1.7 μΩ cm at room temperature, greater than 1.8 μΩ cm at room temperature, greater than 1.9 μΩ cm at room temperature, greater than 2 μΩ cm at room temperature, greater than 2.1 μΩ cm at room temperature, greater than 2.2 μΩ cm at room temperature, greater than 2.3 μΩ cm at room temperature, greater than 2.4 μΩ cm at room temperature, greater than 2.5 μΩ cm at room temperature, greater than 2.6 μΩ cm at room temperature, greater than 2.7 μΩ cm at room temperature, greater than 2.8 μΩ cm at room temperature, greater than 2.9 μΩ cm at room temperature, or greater than greater than 3 μΩ cm at room temperature.

The nanocomposite may have a thermal conductivity of from about 200 W/m K to about 650 W/m K at room temperature. For example, the nanocomposite may have a thermal conductivity of less than 650 W/m K at room temperature, less than 605 less than W/m K at room temperature, less than 600 W/m K at room temperature, less than 550 W/m K at room temperature, less than 505 less than W/m K at room temperature, less than 500 W/m K at room temperature, less than 450 W/m K at room temperature, less than 405 less than W/m K at room temperature, less than 400 W/m K at room temperature, less than 350 W/m K at room temperature, less than 305 less than W/m K at room temperature, less than 300 W/m K at room temperature, less than 250 W/m K at room temperature, less than 205 less than W/m K at room temperature, or less than 200 W/m K at room temperature. Additionally, the nanocomposite may have a thermal conductivity of greater than 200 W/m K at room temperature, greater than 205 less than W/m K at room temperature, greater than 250 W/m K at room temperature, greater than 300 W/m K at room temperature, greater than 305 less than W/m K at room temperature, greater than 350 W/m K at room temperature, greater than 400 W/m K at room temperature, greater than 405 W/m K at room temperature, greater than 450 W/m K at room temperature, greater than 500 W/m K at room temperature, greater than 505 W/m K at room temperature, greater than 550 W/m K at room temperature, greater than 600 W/m K at room temperature, greater than 605 W/m K at room temperature, or greater than 650 W/m K at room temperature.

The nanocomposite may have a coefficient of thermal expansion of from about 5 μm/m K to about 30 μm/m K at room temperature. For example, the nanocomposite may have a coefficient of thermal expansion of less than 30 μm/m K at room temperature, less than 29 μm/m K at room temperature, less than 28 μm/m K at room temperature, less than 27 μm/m K at room temperature, less than 26 μm/m K at room temperature, less than 25 μm/m K at room temperature, less than 24 μm/m K at room temperature, less than 23 μm/m K at room temperature, less than 22 μm/m K at room temperature, less than 21 μm/m K at room temperature, less than 20 μm/m K at room temperature, less than 19 μm/m K at room temperature, less than 18 μm/m K at room temperature, less than 17 μm/m K at room temperature, less than 16 μm/m K at room temperature, less than 15 μm/m K at room temperature, less than 14 μm/m K at room temperature, less than 13 μm/m K at room temperature, less than 12 μm/m K at room temperature, less than 11 μm/m K at room temperature, less than 10 μm/m K at room temperature, less than 9

μm/m K at room temperature, less than 8 μm/m K at room temperature, less than 7 μm/m K at room temperature, less than 6 μm/m K at room temperature, or less than 5 μm/m K at room temperature. Additionally, the nanocomposite may have a coefficient of thermal expansion of greater than 5 μm/m K at room temperature, greater than 6 μm/m K at room temperature, greater than 7 μm/m K at room temperature, greater than 8 μm/m K at room temperature, greater than 9 μm/m K at room temperature, greater than 10 μm/m K at room temperature, greater than 11 μm/m K at room temperature, greater than 12 μm/m K at room temperature, greater than 13 μm/m K at room temperature, greater than 14 μm/m K at room temperature, greater than 15 μm/m K at room temperature, greater than 16 μm/m K at room temperature, greater than 17 μm/m K at room temperature, greater than 18 μm/m K at room temperature, greater than 19 μm/m K at room temperature, greater than 20 μm/m K at room temperature, greater than 21 μm/m K at room temperature, greater than 22 μm/m K at room temperature, greater than 23 μm/m K at room temperature, greater than 24 μm/m K at room temperature, greater than 25 μm/m K at room temperature, greater than 26 μm/m K at room temperature, greater than 27 μm/m K at room temperature, greater than 28 μm/m K at room temperature, greater than 29 μm/m K at room temperature, or greater than 30 μm/m K at room temperature.

The nanocomposite may have a specific heat of from about 0.1 J/g ° C. to about 0.9 J/g ° C. The nanocomposite may have specific a heat less than 0.9 J/g ° C., less than 0.8 J/g ° C., less than 0.7 J/g ° C., less than 0.6 J/g ° C., less than 0.5 J/g ° C., less than 0.4 J/g ° C., less than 0.3 J/g ° C., less than 0.2 J/g ° C., or less than 0.1 J/g ° C. Additionally, the nanocomposite may have a specific heat greater than 0.1 J/g ° C., greater than 0.2 J/g ° C., greater than 0.3 J/g ° C., greater than 0.4 J/g ° C., greater than 0.5 J/g ° C., greater than 0.6 J/g ° C., greater than 0.7 J/g ° C., greater than 0.8 J/g ° C., or greater than 0.9 J/g ° C.

The nanocomposite may have a tensile strength of from about 40 MPa to about 600 MPa. For example, the nanocomposite may have a tensile strength of less than 600 MPa, less than 580 MPa, less than 560 MPa, less than 540 MPa, less than 520 MPa, less than 500 MPa, less than 480 MPa, less than 460 MPa, less than 440 MPa, less than 420 MPa, less than 400 MPa, less than 380 MPa, less than 360 MPa, less than 340 MPa, less than 320 MPa, less than 300 MPa, less than 280 MPa, less than 260 MPa, less than 240 MPa, less than 220 MPa, less than 200 MPa, less than 180 MPa, less than 160 MPa, less than 140 MPa, less than 120 MPa, less than 100 MPa, less than 80 MPa, less than 60 MPa, less than 52 MPa, or less than 40 MPa. Additionally, the nanocomposite may have a tensile strength greater than 40 MPa, greater than 52 MPa, greater than 60 MPa, greater than 80 MPa, greater than 100 MPa, greater than 120 MPa, greater than 140 MPa, greater than 160 MPa, greater than 180 MPa, greater than 200 MPa, greater than 220 MPa, greater than 240 MPa, greater than 260 MPa, greater than 280 MPa, greater than 300 MPa, greater than 320 MPa, greater than 340 MPa, greater than 360 MPa, greater than 380 MPa, greater than 400 MPa, greater than 420 MPa, greater than 440 MPa, greater than 460 MPa, greater than 480 MPa, greater than 500 MPa, greater than 520 MPa, greater than 540 MPa, greater than 560 MPa, greater than 580 MPa, or greater than 600 MPa.

The nanocomposite may have a bulk modulus of elasticity of from about 60 GPa to about 300 GPa. The nanocomposite may have a bulk modulus of elasticity of less than 300 GPa, less than 290 GPa, less than 280 GPa, less than 270 GPa, less than 260 GPa, less than 250 GPa, less than 240 GPa, less than 230 GPa, less than 220 GPa, less than 210 GPa, less than 200 GPa, less than 190 GPa, less than 180 GPa, less than 170 GPa, less than 160 GPa, less than 150 GPa, less than 140 GPa, less than 130 GPa, less than 120 GPa, less than 110 GPa, less than 100 GPa, less than 90 GPa, less than 80 GPa, less than 70 GPa, or less than 60 GPa. Additionally, the nanocomposite may have a bulk modulus of elasticity of greater than 60 GPa, greater than 70 GPa, greater than 80 GPa, greater than 90 GPa, greater than 100 GPa, greater than 110 GPa, greater than 120 GPa, greater than 130 GPa, greater than 140 GPa, greater than 150 GPa, greater than 160 GPa, greater than 170 GPa, greater than 180 GPa, greater than 190 GPa, greater than 200 GPa, greater than 210 GPa, greater than 220 GPa, greater than 230 GPa, greater than 240 GPa, greater than 250 GPa, greater than 260 GPa, greater than 270 GPa, greater than 280 GPa, greater than 290 GPa, or greater than 300 GPa.

3. Use of Nanocomposites

The nanocomposites may be applied in a variety of different fields. The nanocomposites may be used in electrical wires. Additionally, the nanocomposites may be used in industries, such as the automobile, aerospace and space, aircraft, structural, electronic and sporting industries.

EXAMPLES

The foregoing may be better understood by reference to the following examples, which are presented for purposes of illustration and are not intended to limit the scope of the invention.

Example 1. Synthesis and Characterization of the Nanocomposite

Figure 3:
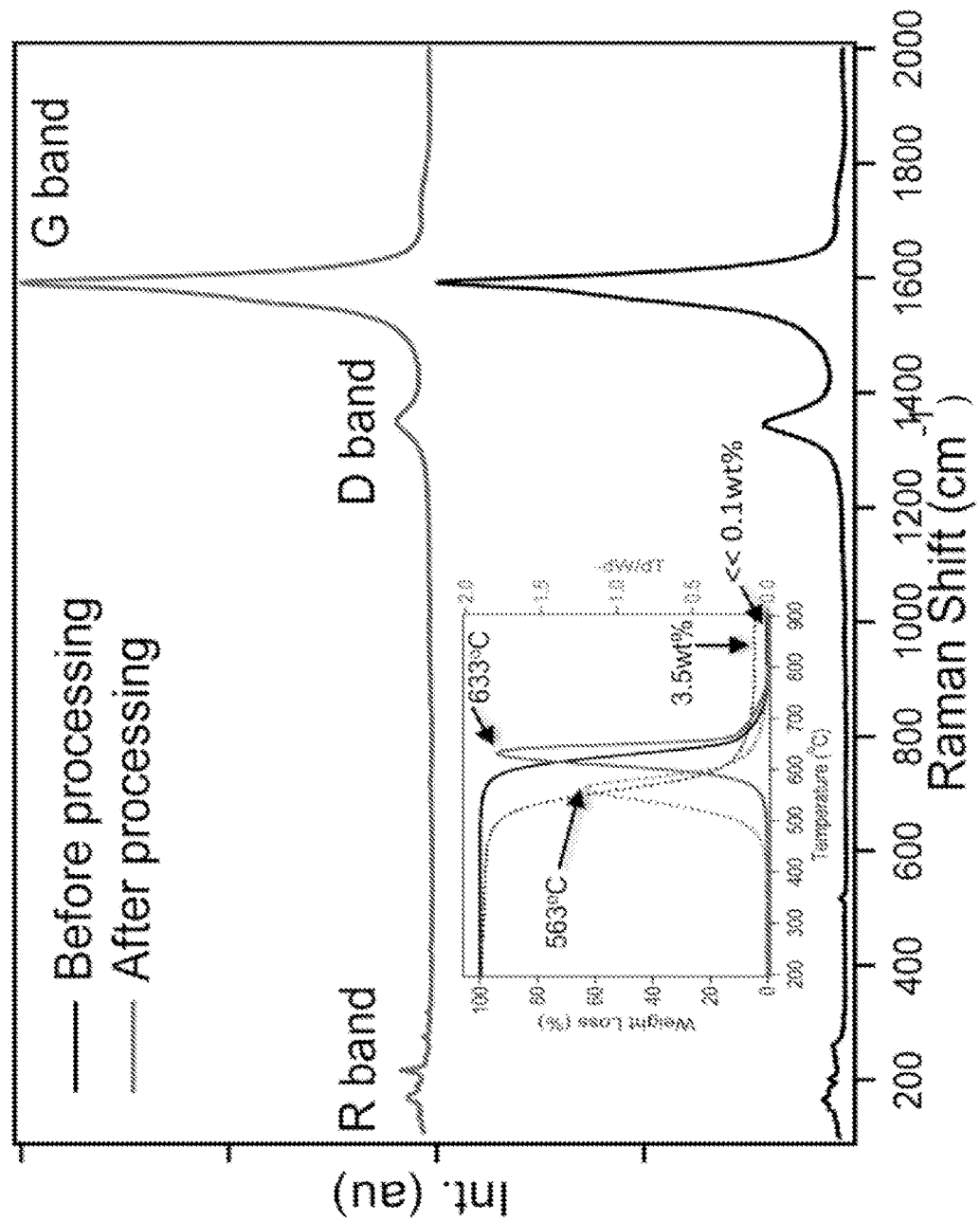
FIG. 3 shows Raman spectra of single-walled CNT (SW-CNT) powder before and after purification. The inset is the corresponding TGA analysis.

A wet chemistry approach may be used to either coat the surface of the CNTs with boron or substitute the boron into the CNT skeletal structure. High purity CNTs may be used for the nanocomposite fabrication. Most commercial CNTs have high impurity content which may be detrimental to the properties of the nanocomposites. A chlorination technique may be used to digest the impurities in the CNTs, which may reduce the residual impurity content to about part per million (ppm) levels. This level has been achieved in the CNTs, as shown in FIG. 3, which is a comparison of the Raman spectra of the CNTs before purification and after purification and high temperature treatment under an Argon/Hydrogen (95%, 5%) mixed gas environment. The decrease in the D band intensity is a sign of improvement in sample quality. This is confirmed by the TGA data (FIG. 3 inset), wherein the residual weight of the noncarbonaceous impurities decreased from 3.5 wt. % to below the detection limit of the TGA. The combustion temperature increased from about 563° C. to about 633° C. Such high purity and high quality CNTs may be used to fabricate the B-CNT hybrid.

Figure 4:
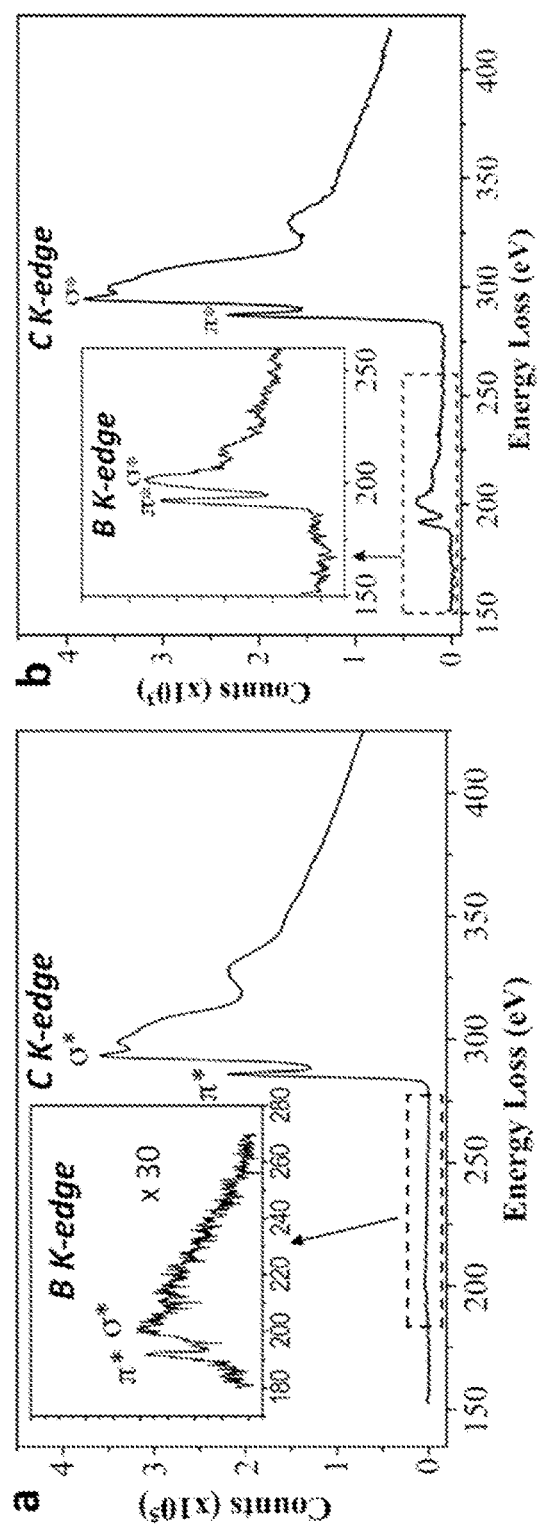
FIG. 4 shows EELs data of B substituted SWCNT.

In the wet chemistry technique, a mild etchant such as bromine is used to spontaneously disperse the CNTs under continuous stirring to create reactive sites on the CNT skeletal structure. To fabricate a B-CNT hybrid material, a precursor such as $BBr_3$ or $BI_3$ may be used. First, the precursor is dissolved in the Br-liquid under a continuous magnetic stirring. Second, the high purity CNT powder is added to the suspension to disperse the CNTs. The CNTs disperse spontaneously in the Br-liquid due to charge transfer that decreases the Van der Waal interactive forces between the tubes. An advantage of using such a process includes, the mild etchant (Br) creates highly reactive sites on the CNT skeletal structure. These highly reactive sites may act as an anchor for the B on the CNT surface; which may facilitate site directed in situ grafting of the B on the CNT structural surface. Additionally, the liquid environment may permit atomic level loading which may facilitate control of the B content and subsequent nanoparticle size. Different boron substitutions may be achieved by varying either the processing time or the initial precursor concentration in the Br-liquid. The excess bromine is removed via evaporation and cryogenic trapping, and the residual bromine in the hybrid is removed by temperature treatment under an argon/hydrogen (95%, 5%) mixed gas environment. B-CNT hybrids of different B contents are shown in FIG. 4, wherein the EELs data of B-doped CNTs is demonstrated at different doping rates. Other hydrides of Sb, Sn, Cd, Ni, Zn, and Fe may be used for the same purpose. Other methods including the use of $B_2(CO_3)_3$ and ammonia gas may be used to introduce boron into the CNT, and mechanochemical ball milling may be used to introduce Sb, Sn, Cd, Ni, Zn, and Fe in/onto the CNTs. Also, nitrogen can be introduced during the synthesis of the CNTs using acetonitrile and ferrocene.

Al was used to fabricate a Al-CNT nanocomposite. The inductive melting technique was used to provide an in situ stirring mechanism to achieve uniform dispersion of the hybrid CNTs in the Al matrix. To prevent oxidation of the Al and CNTs, the melting process was done under an inert environment (e.g., nitrogen gas). The system was purged several times to remove oxygen, and heated to approximately 850° C. for about two hours. The inductive melting technique may take advantage of the induced current, eddy current, which can generate shear force in the melt to provide in-situ mixing during the melting process. This is advantageous to avoid phase separation of the CNTs within the aluminum. The melt is poured into a built-in rod under the inert environment. The rod is polished and drawn into wires at room temperature using a wire-drawing machine. In the case of copper, the melting may be done at temperatures above 1100° C., and one preferred temperature is 1200° C. The CNTs may be suspended with or without a dispersant. The CNTs may contain dopants, such as B, Be, N, Zn, Cd and Ag. The system may be purged several time to remove any residual oxygen before heating. The boron may be added during the synthesis process using diborene or pure boron powder. Such techniques are described in US20100219383, WO2008140649A2 and WO2008140649A3, which are incorporated herein in their entirety by reference for all purposes. The CNTs may be doped with boron after synthesis using boron carbonate under ammonia environment at high temperatures between 500° C. and 1000° C. The element may be added to the CNTs after synthesis using reactive mechanochemical ball milling. Such techniques are described in PCT/US2006/048869, which is incorporated herein in its entirety by reference for all purposes.

Zn may be added to the CNT using $ZnI_2/Br_2$ or $ZnCl_2/Br_2$ or $ZnBr_2/Br_2$. Ag may be added to the CNT using $AgCl/Br_2$ or $ArI/Br_2$ or $AgBr/Br_2$. Ni may be added to the CNT using $NiCl_2/Br_2$ or $NiBr_2/Br_2$ and $NiI_2/Br_2$. Cd may be added to the CNT using $CdCl_2/Br_2$ or $CdI_2/Br_2$ or $CdBr_2/Br_2$. Fe may be added to the CNT using $FeCl_2/Br_2$ or $FeBr_2/Br_2$ or $FeI_2/Br_2$. Sn may be added to the CNT using $SnCl_2/Br_2$ or $SnBr_2/Br_2$ or $SnI_2/Br_2$. Sb may be added to the CNT using $SbCl_2/Br_2$ or $SbI_5/Br_2$ or $SbBr_5/Br_2$. Nitrogen may be added to the CNT during the synthesis using $NH_3$, pyridine or acetonitrile.

Figure 5:
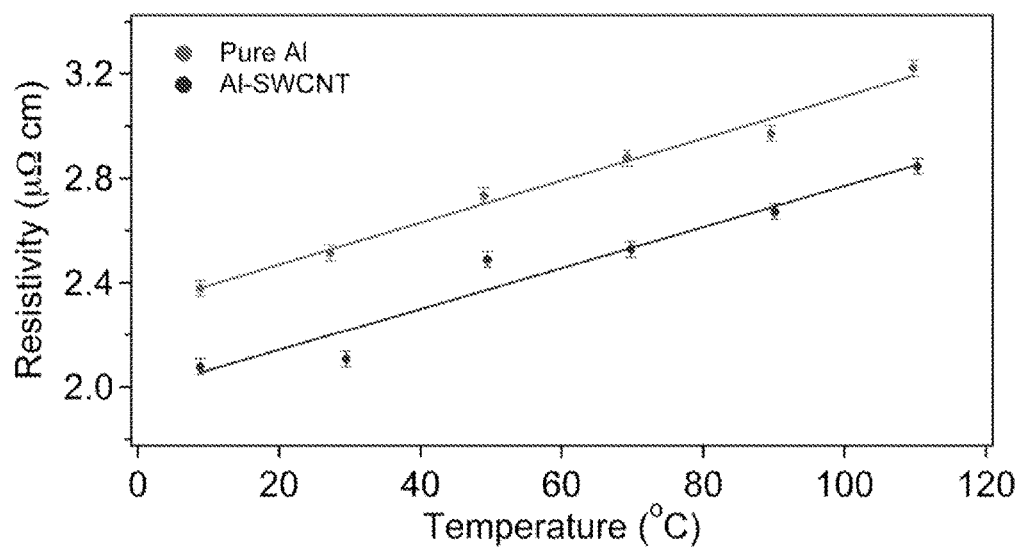
FIG. 5 shows resistivity of pure Al and Al-CNT composite from 10° C. to 120° C.
Figure 6:
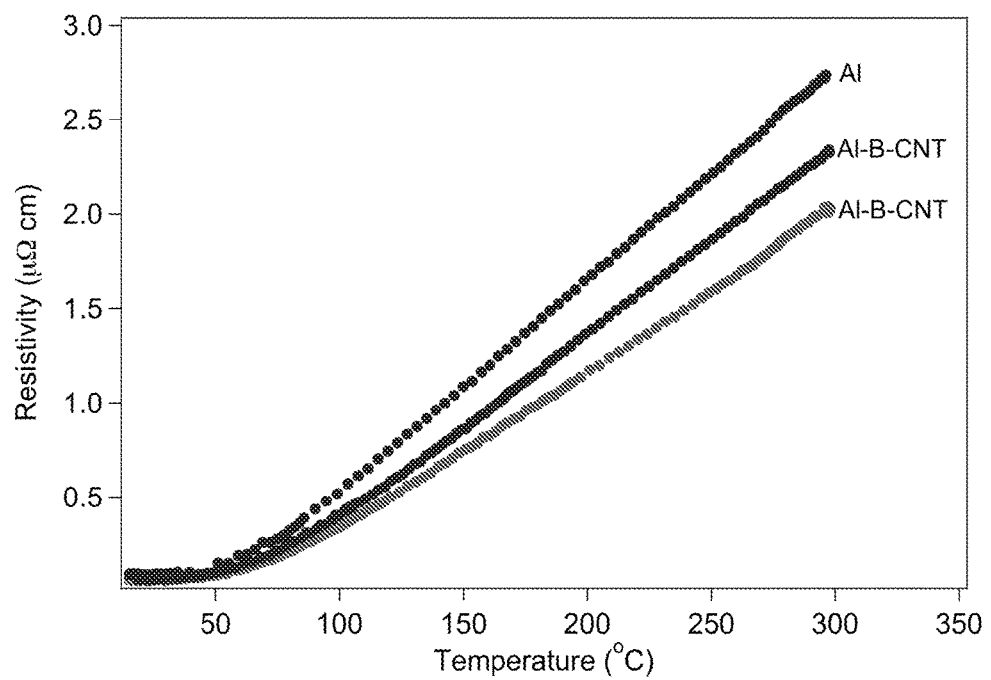
FIG. 6 shows resistivity of pure Al and Al-CNT composite from liquid helium temperature (4K) to room temperature (300K).
Figure 7:
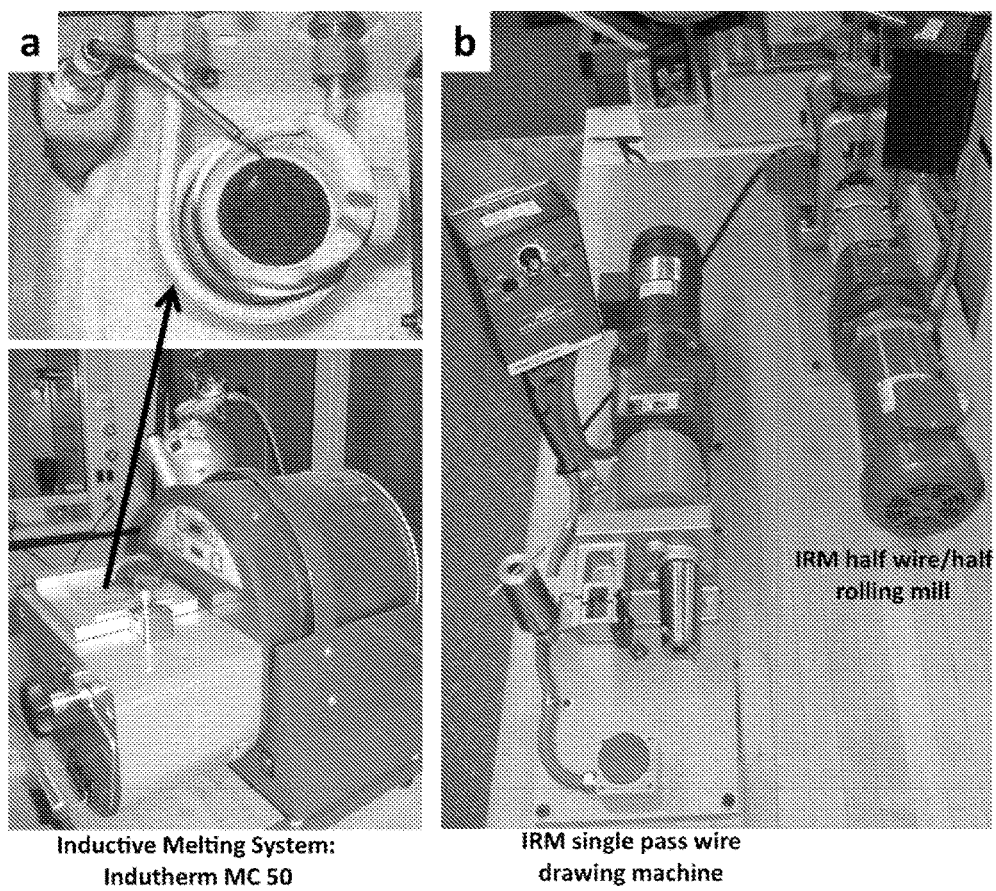
FIG. 7 shows optical images of (a) the Indutherm MC 50 inductive melting system and the melting chamber, and (b) International Rolling Mills single pass wire drawing machine and half wire/half rolling mill.

The B hybrid-SWCNTs were incorporated into Al to form an Al-CNT composite at about 0.01 wt. % (no pre-dispersion of CNTs with block copolymer) to fabricate Al-CNTs rods using an inductive melting system, as described above (Indutherm MC 50, FIG. 7). The rods were drawn into 1.0 mm diameter wires using the IRM wire drawing machines. The wires were cut into 20 cm long pieces to probe the bulk resistivity of 15 cm on a four-probe resistivity measurement system (built in-house) from 10° C. (283K) to 110° C. (383K). The probe was immersed in silicone oil in a circulating bath to provide constant temperature during measurement. Two K-type thermocouples were used to monitor the temperature of the bath. The average of several bulk resistivity measurements of the Al-SWCNT composites compared to that of pure Al fabricated under the same conditions is shown in FIG. 5. The nanocomposites exhibited approximately a 12% decrease in resistivity. 15 mm pieces of other wires were measured from 4K to 300K that exhibited between 26% and 15% reduction in resistivity as shown in FIG. 6.

Micro-Raman spectroscopy and SEM may be used to obtain information on the dispersion of the CNTs in the Al matrix. A systematic micro-Raman mapping of the tangential mode of the CNT on fractured surfaces of the composite wires may be used to develop a contour distribution of the CNTs in the matrix, which may provide information on the dispersion and clustering of the CNTs in the Al-CNT composites. The SEM images of the same fractured surfaces of the Al-CNT composite wires may be used as a complimentary tool to map out the distribution of the CNTs in the Al matrix. A contour plot of the variation of the CNTs content along the micrographs may provide additional information to the micro-Raman results.

One of the major challenges in Al-CNT composite fabrication is the nonwettability of the CNT by the Al liquid. The wetting may be described in terms of the surface energies of the interacting species by the Young's equation and the Young-Dupre relation expressed as:

$$\cos \theta = \frac{\gamma_{SV} - \gamma_{LS}}{\gamma_{LV}} \text{ and } W_A = \gamma_{LV}(1 + \cos \theta) \quad (1)$$

reinforced Al composites. It may be shown that the formation of $Al_4C_3$ causes a reduction in strength and premature failure of 75 vol. % carbon fiber reinforced A357 alloy. Thus, the formation of $Al_4C_3$ needs to be avoided. However, there have been reports of improvement of the properties of Al—SiCp composites due to limited amounts of $Al_4C_3$. In the case of CNT-reinforced Al composites, it is suggested that the $Al_4C_3$ may help in load transfer by potentially pinning the CNTs to the matrix. In CNT reinforced Al composites, the critical thickness for the carbide nucleation can be expressed as $$t_c = V_m \frac{\Delta \gamma}{\Delta G_f} \quad (2)$$

where $V_m$ is the molar volume of the carbide formed, $\Delta G_f$ is the free energy of formation per mole of carbide and $\Delta \gamma$ is the increase in the total surface energy as a result of the formation of new interface. When carbide thickness reaches $t_c$, further growth is energetically favorable. This may result in a decrease in contact angle and an improvement in wetting. Smaller $t_c$ values therefore suggest easy formation of carbide as well as better wetting. The surface tension of CNTs is approximately 45.3 mJ m$^{-1}$, which is similar to that of the carbon fiber. It has been shown that a liquid with surface tension between 100 mN m$^{-1}$ and 200 mN m$^{-1}$ results in good wetting with CNT. Molten Al alloys on average have a surface tension of ~800 mN m$^{-1}$. Thus, the wetting between Al alloys and CNTs is expected to be poor. It has been demonstrated experimentally that Al alloys do not wet graphite in the beginning and exhibit a large contact angle of approximately 160°. The chemical interaction at the interface may be modified to limit the formation of Al$_4$C$_3$ that could have detrimental effects on the properties of the composites. This may be achieved by coating the surface of the CNT with B or substituting B into the CNT structure. Thus, the B may facilitate the formation of the interfacial bonding that reduces the contact angle and the surface tension, potentially promoting the wetting of the CNTs by the Al liquid. The nature of the bonding has significant effect on the strength of the composite. High resolution TEM may be used to perform studies of the Al and the CNT interface, which can identify the type of bonding that facilitates enhanced properties of the composites.

CNTs are predicted to be ballistic conductors with a resistance (6454 Ω/tube) independent of the tube length. For tubes in the range of 5-10 μm in length, this would correspond to a bulk resistivity several times lower than that of Al, Cu and Ag. Thus, a composite consisting of CNTs embedded in an Al-matrix might work as an ultra-low-resistive material with the potential of having a room-temperature resistivity far below Al, Cu and Ag. As noted above, B may provide necessary interfacial bonding between the CNTs and the Al matrix with limited effect on the electrical properties and could facilitate the fabrication of such material.

A systematic investigation may be performed to assess the effect of CNT content in enhancing the electrical conductivity of the Al-CNT composite using two systems. One system consists of a 4-probe resistivity apparatus that can probe the conductivity of 25 cm long wires from ~260K to 450K in a circulator bath, and the other system is a closed cycle cryostat to probe the resistivity of 2 cm long wires from 4K to 450K. These two measurement systems may provide information on the uniformity of the composites. The bulk resistivity (ρ) of a metal conducting wire is determined using the equation:

$$\rho = \frac{RA}{L} \quad (3)$$

where R is the measured resistance of a wire of length L and cross-sectional area A. A 4-probe resistance is used and the diameter of the wire is investigated using a Keithley 2000 multimeter and a digital caliper. The resistivity is calculated using the length between the voltage leads. The electrical conductivity (σ) may be determined using the expression σ=1/ρ.

Several models have been developed to predict the strength and elastic modulus of CNT-matrix composites. The model listed below relates the strength of the Al-CNT composite (σ$_c$) to the properties of the interfacial region to estimate the shear strength (σ$_s$) of the interface. The strength of the composite (σ$_c$) may be expressed as:

$$\sigma_c = \left(1 + \frac{2w}{d}\right)\left[\frac{\sigma_s L}{d} - \left(1 + \frac{2w}{d}\right)\sigma_m\right]V_{CNT} + \sigma_m \quad (4)$$

where σ$_m$ is the strength of the matrix, V$_{CNT}$ is the CNT volume fraction, L is the length of the CNT, w is the width of the inter-phase and d is the diameter of CNT. The strength of the composite may be higher for higher interfacial shear strength values.

Additionally, the combined Voigt-Reuss model for randomly oriented fibers in a composite may be used to determine the elastic modulus of the Al-CNT composites. The elastic modulus of the composite (E$_c$) is expressed as:

$$E_c = \frac{3}{8}[V_{CNT}E_f + (1 - V_{CNT})E_m] + \frac{5}{8}\left[\frac{E_f E_m}{E_f(1 - V_{CNT}) + E_m V_{CNT}}\right] \quad (5)$$

where E$_f$ and E$_m$ are the elastic moduli of the CNT and the matrix, respectively. All other parameters are as defined previously. High-resolution transmission electron microscope may be used to study the CNT-matrix interfacial morphology. The Intron 33R 4466 mechanical tester may be used to perform the mechanical properties studies.

The invention claimed is:

1. A nanocomposite comprising metal and carbon-based nanotube (CNT), wherein the carbon-based nanotube comprises a doping element selected from the group consisting of boron (B), iron (Fe), zinc (Zn), nickel (Ni), cadmium (Cd), tin (Sn), antimony (Sb), Nitrogen (N) and the combination thereof, and wherein the nanocomposite comprises about 0.00001 wt % to about 40 wt % carbon-based nanotube.

2. The nanocomposite of claim 1, wherein the metal is aluminum or copper.

3. A method of synthesizing a nanocomposite, the method comprising:
   (a) suspending a doped carbon-based nanotube and metal in a suspension, wherein the carbon-based nanotube comprises a doping element selected from the group consisting of boron (B), iron (Fe), zinc (Zn), nickel (Ni), cadmium (Cd), tin (Sn), antimony (Sb), Nitrogen (N) and the combination thereof; and
   (b) inductively melting the suspension comprising the carbon-based nanotube and metal to provide a metal, doped CNT nanocomposite.

4. The method of claim 3, wherein the metal is aluminum or copper.

5. The method of claim 3, wherein the doping element is presented as an adatom, cluster, nanoparticle, or a combination thereof.

6. The method of claim 3, wherein the carbon-based nanotube is selected from a SWCNT, DWCNT and MWCNT.

7. The method of claim 3, wherein the suspension further comprises a dispersant.

8. The method of claim 3, wherein the doping element is comprised on the surface of the CNT, within the skeletal structure of the CNT, or a combination thereof.

9. The method of claim 3, wherein the CNT is doped via a gas phase, liquid phase or solid phase.

10. The method of claim 9, wherein the liquid phase further comprises a halogen.

11. The method of claim 9, wherein the gas phase further comprises ammonia or B$_2$(CO$_3$)$_3$.

12. The method of claim 9, wherein the solid phase comprises nanoclusters of the doping element, wherein the CNT is doped using a mechanochemical ball milling technique.

13. The method of claim 3, wherein the doping element is presented as a halide precursor prior to doping the CNT.

14. The method of claim 3, further comprising purifying the carbon-based nanotube prior to contacting the suspension of step (a).

15. The method of claim 3, further comprising suspending the carbon-based nanotube in a dispersant prior to contacting the suspension of step (a).

16. The method of claim 3, further comprising the use of the carbon-based nanotube without a dispersant.

17. An automobile, aircraft, aerospace and space, electronic component or sporting device comprising the nanocomposite of claim 1.

18. An electrical wire comprising the nanocomposite of claim 1.

19. A composite material comprising aluminum and boron doped-CNT, wherein the composite material comprises about 0.00001 wt % to about 40 wt % carbon-based nanotube.

20. The composite of claim 19, wherein the carbon-based nanotube is selected from a SWCNT, DWCNT and MWCNT.

21. The method of claim 3, wherein the metal comprises granules.

22. The method of claim 3, wherein the carbon-based nanotubes are evenly dispersed within the nanocomposite.

23. The method of claim 3, wherein the CNT is presented as a single CNT, a bundle of CNTs, or a combination thereof.

24. The method of claim 3, wherein the CNT comprises a diameter of from 0.5 nm to 50 nm, and a length of from 0.5 µm to 1000 µm.

25. The method of claim 3, wherein the nanocomposite comprises the CNT at from 0.00001 wt. % to 40 wt. %.

26. The method of claim 3, wherein the nanocomposite has a bulk resistivity of from 0.5 µΩcm to 3 µΩcm at room temperature.

27. The method of claim 3, wherein the nanocomposite has a thermal conductivity of from 200 W/m K to 650 W/m K at room temperature.

28. The method of claim 3, wherein the nanocomposite has a coefficient of thermal expansion of from 5 µm/m K to 30 µm/m K at room temperature.

29. The method of claim 3, wherein the nanocomposite has a specific heat of from 0.1 J/g° C. to 0.9 J/g° C.

30. The method of claim 3, wherein the nanocomposite has a tensile strength of from 40 MPa to 600 MPa.

31. The method of claim 3, wherein the nanocomposite has a bulk modulus of elasticity of from 60 GPa to 300 GPa.

* * * * *